US009705465B2

(12) United States Patent
Bodnar et al.

(10) Patent No.: US 9,705,465 B2
(45) Date of Patent: Jul. 11, 2017

(54) CLOSED LOOP CONTROL SYSTEM, AND AN AMPLIFIER IN COMBINATION WITH SUCH A CLOSED LOOP CONTROL SYSTEM

(71) Applicant: ANALOG DEVICES GLOBAL, Hamilton (BM)

(72) Inventors: Rares Andrei Bodnar, Basingstoke (GB); Patrick Joseph Pratt, Mallow (IE); Donal Bourke, Mallow (IE); Peter James Tonge, Newbury (GB)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/464,611

(22) Filed: Aug. 20, 2014

(65) Prior Publication Data

US 2015/0061769 A1 Mar. 5, 2015

(30) Foreign Application Priority Data

Aug. 29, 2013 (GB) .................................. 1315389.5

(51) Int. Cl.
*H03G 3/30* (2006.01)
*H03F 3/21* (2006.01)
(Continued)

(52) U.S. Cl.
CPC .......... *H03G 3/3042* (2013.01); *H03F 1/301* (2013.01); *H03F 1/3205* (2013.01); *H03F 3/193* (2013.01);
(Continued)

(58) Field of Classification Search
USPC ................................ 330/285, 296, 277, 282
See application file for complete search history.

(56) References Cited

U.S. PATENT DOCUMENTS 6,008,698 A 12/1999 Dacus et al.
6,734,729 B1 * 5/2004 Andrys ................ H03G 3/3042
330/107
(Continued)

FOREIGN PATENT DOCUMENTS

CN 1223031 A 7/1999
CN 1512664 A 7/2004
(Continued)

OTHER PUBLICATIONS

Extended European Search Report of May 27, 2015 for European Patent Application No. 14182044.9. 16 pages.
(Continued)

*Primary Examiner* — Hieu Nguyen
(74) *Attorney, Agent, or Firm* — Knobbe, Martens, Olson & Bear, LLP

(57) ABSTRACT

A control apparatus is provided that can provide high dynamic resolution and is suitable for inclusion within an integrated circuit. The control apparatus receives a demand signal representing a desired value of a measurand, and a feedback signal representing a present value or a recently acquired value of the measurand. The processing circuit forms a further signal a further signal which is a function of the demand and feedback signals. The further signal is then subjected to at least an integrating function. The demand signal, feedback signal or the further signal is processed or acquired in a sampled manner. The use of such sampled, i.e. discontinuous, processing allows integration time constants to be synthesized which would otherwise require the use of unfeasibly large components within an integrated circuit, or the use of off-chop components. Both of these other options are expensive.

22 Claims, 9 Drawing Sheets

(51) Int. Cl.
  *H03G 3/00* (2006.01)
  *H03F 3/193* (2006.01)
  *H03F 1/30* (2006.01)
  *H03F 1/32* (2006.01)
(52) U.S. Cl.
  CPC .............. *H03F 3/21* (2013.01); *H03G 3/001* (2013.01); *H03G 3/3089* (2013.01); *H03F 2200/129* (2013.01); *H03F 2200/144* (2013.01); *H03F 2200/18* (2013.01); *H03F 2200/451* (2013.01); *H03F 2200/462* (2013.01); *H03F 2200/481* (2013.01)

(56) References Cited

U.S. PATENT DOCUMENTS

| | | | |
|---|---|---|---|
| 7,084,799 B1 | 8/2006 | Butler | |
| 7,154,338 B2 * | 12/2006 | Chacko | H03G 3/3047 330/129 |
| 9,024,533 B2 * | 5/2015 | Gossehelweg | G05F 1/10 315/209 R |
| 2004/0183594 A1 | 9/2004 | Persson | |
| 2008/0268807 A1 | 10/2008 | Oddoart et al. | |

FOREIGN PATENT DOCUMENTS

| | | |
|---|---|---|
| CN | 102474225 A | 5/2012 |
| WO | WO 97 49175 | 12/1997 |
| WO | WO 97/49175 | 12/1997 |
| WO | WO 2009 101486 | 8/2009 |

OTHER PUBLICATIONS

Partial European Search Report of Feb. 9, 2015 for European Patent Application No. 14182044.9, 9 pages.
Office Action dated Aug. 6, 2015 for Chinese Patent Application No. 201410432667.9, 10 pgs.
Office Action dated Apr. 5, 2016 for Chinese Patent Application No. 201410432667.9, 4 pages.

* cited by examiner

CLOSED LOOP CONTROL SYSTEM, AND AN AMPLIFIER IN COMBINATION WITH SUCH A CLOSED LOOP CONTROL SYSTEM

CROSS REFERENCE TO RELATED APPLICATION

This application claims the priority benefit of Great Britain Patent Application No. 1315389.5, filed Aug. 29, 2013, titled "CLOSED LOOP CONTROL SYSTEM, AND AN AMPLIFIER IN COMBINATION WITH SUCH A CLOSED LOOP CONTROL SYSTEM," which is hereby incorporated by reference herein in its entirety.

FIELD

The present disclosure relates to a closed loop control system. The closed loop control system can allow regulation of a controlled system with a resolution, which may be a dynamic resolution, to be achieved that may be better than the resolution of a digital control signal used to set a system parameter to a target value.

BACKGROUND

Systems that control functions such as gain control of amplifiers or current control through a device often include a closed loop control system such that a suitable circuit receives a target value and automatically controls a target circuit such that it exhibits an appropriate response, such as gain or current flow.

In some systems, fine control is desirable. This generally involves the use of a digital to analog converter having a relatively small step size between adjacent steps. Some systems may have relatively large and variable offset voltages. This tends to involve a digital to analog converter having a sufficiently large output range. If fine control and a large offset occur in a single system, this tends to involve the use of a high resolution digital to analog converter, with associated cost issues in fabricating such a large (e.g., large number of input bits in its input word) precision device. Cost rises because such a device has a bigger footprint on an integrated circuit die. It would be desirable to achieve fine control without having to fabricate high resolution and wide range analog to digital converters.

SUMMARY

Disclosed herein is a control apparatus comprising a processing circuit for receiving a demand signal representing a desired value of a measurand (a quantity or signal to be measured and controlled), and a feedback signal representing the measurand (e.g., the feedback signal can represent a present value of the measurand or a recently acquired value of the measurand). The processing circuit is configured to perform at least an integrating function based on a further signal formed as a function of the demand and feedback signals. The demand signal, the feedback signal or the further signal is processed or acquired in a sampled manner.

The use of discrete (as opposed to continuous) time processing of signals within the control apparatus provides design flexibility and may also be exploited to reduce component size.

The control apparatus may be used to set the current through a transistor of a RF power amplifier, such as those found in mobile telephone systems, TV systems, satellite systems, radar systems and so on. The current through such a transistor may be varied to control the gain of the amplifier.

In an embodiment, the processing circuit may be arranged to synthesize an integrator time constant of a first value from components, such as a resistor-capacitor combination having a second, shorter time constant. This synthesis may be performed by selective connection and disconnection of the integrator, such as one of the resistor-capacitor combination, from a signal node. The connection/disconnection ratio may be programmable. This allows time constants to be synthesized using chip scale components (i.e. resistors and capacitors provided as an integral part of an integrated circuit) to synthesize the performance of components which would not normally or easily be provided within an integrated circuit. The resistor may itself be synthesized by a switched capacitor.

DESCRIPTION OF THE DRAWINGS

The inventive control system and related systems are described herein will now be described by way of non-limiting example only with reference to the accompanying drawings, in which.

DESCRIPTION OF SOME EXAMPLE EMBODIMENTS

Figure 1:
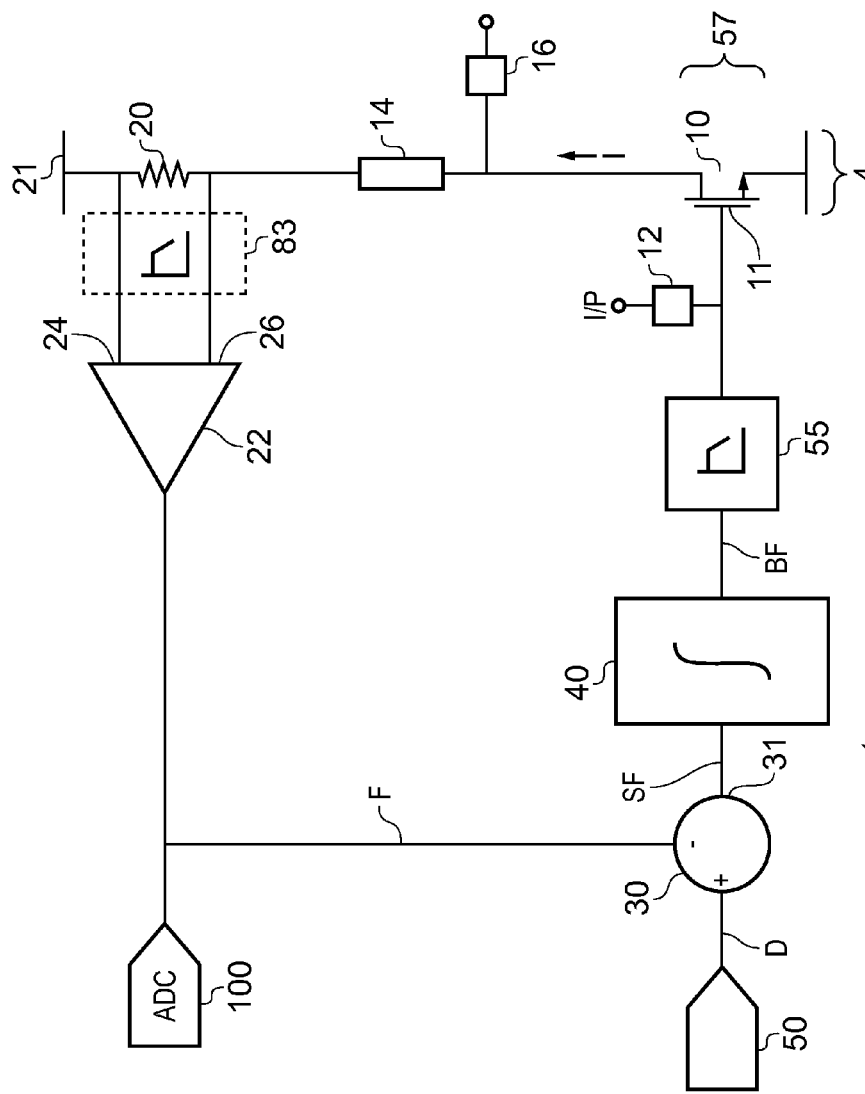
FIG. 1 is a top level schematic diagram of an amplifier and a control loop for the amplifier.

An embodiment of a closed loop controller, generally indicated 2, is shown in association with a radio frequency (RF) amplifier, generally indicated 4, in FIG. 1. The controller 2 implements a control circuit with physical hardware. The control circuit can provide a bias signal for the RF amplifier 4 based on a feedback signal indicative of an output of the amplifier 4 and a demand value indicative of a desired value of the output of the RF amplifier 4. As illustrated, the bias signal can be applied to a gate of a field effect transistor, for example. The system shown in FIG. 1 is arranged to set a current I through a load 14 or a transistor 10 to a predetermined level. It will be understood that setting the current I though either the load 14 or the transistor 10 can set the current flowing through the other of the load 14 and the transistor 10. In the arrangement shown in FIG. 1, the transistor 10 is arranged to function as a radio frequency amplifier with an RF signal being coupled to a gate 11 of the transistor via a signal coupling circuit schematically indicated as 12. The coupling circuit 12 may comprise discrete components, strip line or any other suitable circuitry for handling RF frequency signals. A load 14, such as an inductor, provides a high impedance $Z_L$ to alternating current (AC) signals whilst presenting a relatively low impedance to direct current (DC) signals. An output coupling component or network 16 may be connected to the drain of the transistor 10 to extract an amplified RF signal. The transistor 10 may, for example, be a bipolar junction transistor (BJT), a metal oxide semiconductor field effect transistor (MOSFET), a high electron mobility transistor (HEMT), a heterojunction bipolar transistor (HBT), a metal-semiconductor field effect transistor (MESFET) or a laterally diffused metal oxide semiconductor (LDMOS) transistor. While the terms "metal" and "oxide" may be present in, for example, a MOSFET, the skilled artisan will appreciate that such transistors can have gates made out of materials other than metals, such as polysilicon, and have dielectric oxide regions made from other types of dielectrics other than silicon oxide, such as a high-k dielectric. Moreover, it will be understood that when the transistor 10 is a bipolar transistor, the RF signal is received at the base and the amplified RF signal is provided at the collector and any features discussed herein can be applied to bipolar transistors in power amplifiers, as appropriate. The transistor 10 may also be formed as a plurality of transistors and may be embodied on a monolithic microwave integrated circuit (MMIC) where one or several amplifying stages are present in conjunction with other devices such as capacitors, resistors or transistors. Thus the transistor 10 may be replaced by several transistors. The transistor 10 may have a transconductance that varies with drain current. Thus, the gain of the RF amplifier formed by the transistor 10 and load 14 can be controlled by controlling a quiescent current or a low frequency drain current (i.e. a current with a frequency below the signal band when an RF signal is present) in the device.

In order to sense the low frequency current through the transistor 10, a current sensing resistor 20 is placed in series with the transistor 10. Other current sensing elements can be used, such as (and without limitation) a Hall effect current sensor or magnetic transformer. The current sensing resistor 20 can be placed in series with the drain of the transistor 10 as this can have the least effect on the gain of the transistor, whereas placing the resistor 20 in series with the source of the transistor 10 typically affects the RF gain of the transistor 10. However, in other systems where RF gain is not an issue and the object is to control current through a load then the resistor 20 may be placed in series with the source of the transistor 10.

In the arrangement shown in FIG. 1 the current sensing resistor 20 is connected to the positive power supply rail of the amplifier 4, which in the context of a power amplifier in a data communication system (such as a mobile telephony system, a cable TV system, a satellite communication system, etc.) may be at an voltage of around +5 to +100 Volts, for example. Other voltages may be prevalent in other applications of the control system. The amplifier 4 may also be used in other applications such as radar systems. The resistor 20 is typically low value, often (but not necessarily) less than approximately 1 Ohm, and the voltage difference across the resistor 20 is relatively small with regard to the supply voltage 21. Consequently both nodes of the resistor 21 are relatively close to the positive supply voltage 21. The voltage difference across the resistor 20 may advantageously be amplified for presentation to a control loop of the controller 2, and may also be voltage translated to a voltage range which is more suitable for the control loop of the controller 2 to work with. These operations can be performed by a current sense amplifier 22 which has a first input terminal 24 connected to sense the voltage at a first node of the current sensing resistor 20 and a second input terminal 26 connected to sense the voltage as a second node of the current sensing resistor. It should be noted that other gain and voltage translation circuits are known to the person skilled in the art and can alternatively be implemented. A low-pass filter 83 may be introduced in between the inputs of the current sense amplifier 22 and sense resistor 20 to prevent the aliasing of the radio frequency (RF) signal with the low frequency current signal.

In order to improve amplifier performance, and in particular DC offset performance for a low frequency measurement, the current sense amplifier 22 may undergo periodic auto-zeroing or chopping operations having a chopping/auto-zero frequency $F_{SENSE}$. These features are well known to the person skilled in the art of differential amplifier and instrumentation amplifier design and need not be discussed in detail here. The sense amplifier output signal may present a limited bandwidth (for example because of the low pass filter 83, the bandwidth of the current sense amplifier 22, the use of chopping or because the output is being used in a sampled manner). This may make the system unstable if a pole of a forward signal path (from summer 30 to sense resistor 20) becomes the non-dominant pole of the transfer function. In order to preserve the stability of the feedback loop and facilitate use of an accurate/high gain sense amplifier 22, it can be desirable to set the pole of a forward path 57 at a frequency below that of the pole of the feedback path comprising resistor 20, current sense amplifier 22 and summer 30. The bandwidth limitation of the current sense amplifier 22 can be driven by other factors such as noise or cost. The output signal of the feedback sense amplifier 22 can be single-ended or differential.

The measured current value represents a measurand F which is compared with a demanded current value D by a summer 30 to form a further signal SF at an output 31 which represents the difference between the measured and demanded values. The further signal, which can be regarded as an error signal, may be integrated by an integrator 40.

The demand signal D is provided by a signal source, such as a digital to analog converter (DAC) 50 and is provided, in this example, to a non-inverting input 34 of the summer 30 whereas the measurand F is provided to an inverting input 32. A low pass filter (not shown in FIG. 1) can be introduced in between the DAC 50 and the summer 30 to filter unwanted signal parts such as quantization noise. As noted before, an output of the summer 30 is provided to the integrator 40. The output of the integrator 40 may be buffered by a buffer (not shown in FIG. 1, but shown in FIG. 3) which may provide low impedance drive capability, voltage translation and/or inversion in order to provide a suitable drive signal BF for the transistor 10. The output from the buffer or the integrator may be filtered by a filter 55. This can reduce the noise bandwidth from the buffer 60 being propagated towards the transistor 10, ensure the stability of the power amplifier and also, from an RF point of view, reduce an RF signal path from the gate 11 of the transistor 10 back towards the buffer 60. The buffer 60 need not always be provided.

Additionally the output of the current sense amplifier 22 may be provided to an analog to digital converter (ADC)

100. The ADC 100 may be used to provide signals to a digital circuit that may seek to modify the operation of the closed loop control circuit.

Figure 2:
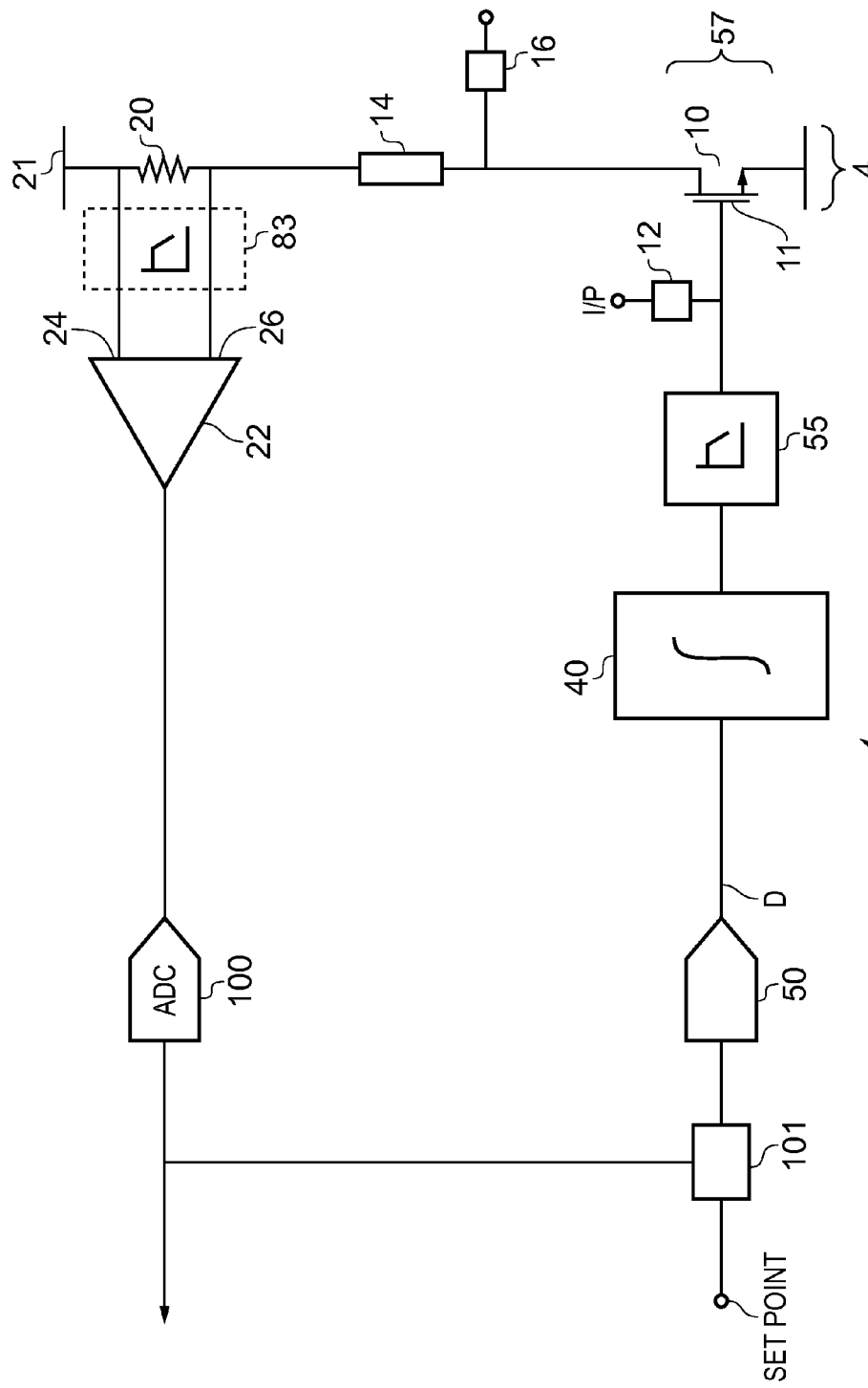
FIG. 2 shows a variation of diagram control loop based on that shown in FIG. 1 where a part of the closed loop is implemented in the digital domain.

FIG. 2 shows an embodiment where the feedback loop is closed in the digital domain. The output of the current sense amplifier 22 is digitized by an analog to digital converter (ADC) 100. The numerical value generated by the ADC 100 is presented to a digital control block 101 which in a basic configuration operates as a summer. The control block 101 may receive a set point signal at one input and the estimate of current at a second input, and process these to form a digital signal for the DAC 50. Other functionality can be added to this block such as (and not limited to) signal pre-distortion and/or dithering.

The forward path, generally designated 57, can have a second order filter transfer function characteristic which also serves to filter quantization noise of the DAC 50 (this can apply to the embodiments shown in FIGS. 1 and 2). This can be exploited to reduce the resolution of the DAC 50, optionally down to 1 bit, by increasing the update frequency of the DAC 50 and integrator 40 above the frequency of the poles of the closed loop. The quantization noise of the DAC 50 can be frequency shifted to high frequencies where a relatively large attenuation is achieved and the system achieves an improved resolution due to the improved signal to noise ratio. This technique is known as oversampling in traditional data converter signal processing.

Figure 3:
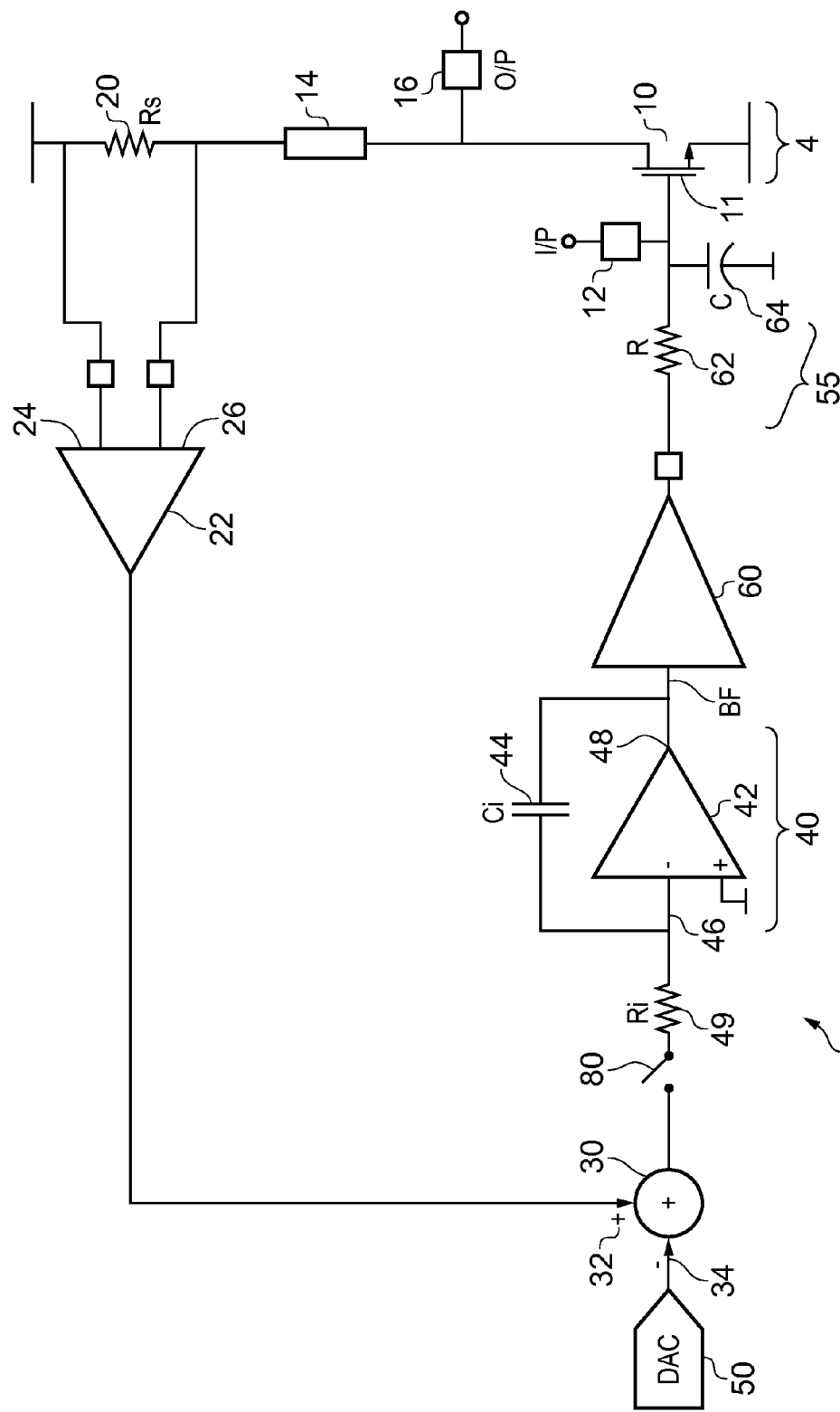
FIG. 3 shows the circuit of FIG. 1 in greater detail.

FIG. 3 shows an embodiment of the circuit of FIG. 1 in greater detail. In the arrangement shown in FIG. 1, the integrator 40 is formed around a differential amplifier 42. The integrator 40 illustrated in FIG. 3 comprises a capacitor 44 connected between an inverting input 46 and an output 48 of the amplifier 42. A resistor 49 is connected between the inverting input 46 of the integrator 40 and the output of the summer 30. This combination of the capacitor 44 and the resistor 49 forms an integrator with a time constant determined by the value Ci of the capacitor 44 and the value Ri of the resistor 49. Furthermore the resistor 49 sets a load impedance on the summer 30 as the inverting input acts as a virtual ground. In FIG. 3, the low pass filter 55 is formed by resistor 62 connected between the output of the buffer 60 and the gate 11 of the transistor 10, and capacitor 64 connected between the gate of the transistor 10 and a signal ground.

A feature of Gallium Arsenide, Gallium Nitride and similar heterojunction FETs is that the gate typically draws a current and this current is a function of the RF signal amplitude. There may also be a gate current component that is independent of the RF signal. Thus an offset $V_{OFF}$ can exist as a product of the gate current and the resistance of the resistor 62. In some circuit configurations where the transistor 10 acts as an RF power amplifier, the value of $V_{OFF}$ may be up to several Volts. Additionally the threshold voltage $V_T$ of the transistor 10 can be considered as an offset. Thus it may be desirable for the signal BF to span over a relatively wide range to account for $V_{OFF}$ and $V_T$ (several volts), even though the variation of the $V_{GS}$ required to achieve drain current variation can be relatively small (determined by the transconductance of the transistor), for example in the order of tens to hundreds of millivolts or so.

If the signal BF was generated directly by a DAC, in order to achieve a specific dynamic range of the drain current, the DAC dynamic range would typically be significantly greater than this, in order to account for the value of $V_{OFF}$ and $V_T$. Due to the nature of the closed loop of FIG. 1, 2 or 3, where the DAC 50 output sets the drain current instead of $V_{GS}$, the DAC dynamic range matches the dynamic range desired for the drain current. The value of $V_{OFF}$, $V_T$ and transistor transconductance may all change as function of external elements like temperature. This variation can be cancelled out by the closed loop controller 2, which can maintain the drain current to the value set by the DAC 50 scaled by the feedback path elements (the sense resistor 20, the current sense amplifier 22, etc.). As the relationship between gain and drain current is a known (or measurable), the input code of the DAC 50 can correspond to specific gain value of the amplifier 4, which can be a power amplifier as illustrated.

Further, for the case where the signal BF is generated directly by a DAC 50, the output buffer 60 would typically have to ensure the scaling and level shifting of the signal. If this function was implemented by a feedback amplifier, the noise of the amplifier would typically be scaled by a factor greater than one. This contrasts with the approach used here where the integrator 40 can have a noise scaling factor of one and can achieve an output range only limited by the supply voltage.

In a data communication system, it may be desirable to match the transmit amplifier gain and receiver gain to quite close tolerances. The receiver may have a limited gain tracking bandwidth, hence the desire for the transmitter's gain variation to have a bandwidth in accordance with the receiver. If the transmitter's amplifier gain is to be varied in a linear manner (i.e., a ramp) then the receiver's specifications may specify a limited slope (slew rate) of the ramp. This ramp may be described by discrete steps $\Delta G_{MAX}$ that may be filtered by the low-pass filter 55 to give a smoother transition in accordance with the receiver requirements. For each increment or decrement of the DAC 50, the closed loop controller 2 can regulate the signal BF in order to achieve the desired drain current step corresponding to $\Delta G_{MAX}$.

In one example, the active range of the amplifier 4 is 10 dB and the maximum gain step $\Delta G_{MAX}$ is equal to 0.1 dB. For a linear transfer function between the gain and drain current this translates into 100 discrete steps to be produced by the DAC 50, which equates to 7 bit resolution.

Figure 4A:
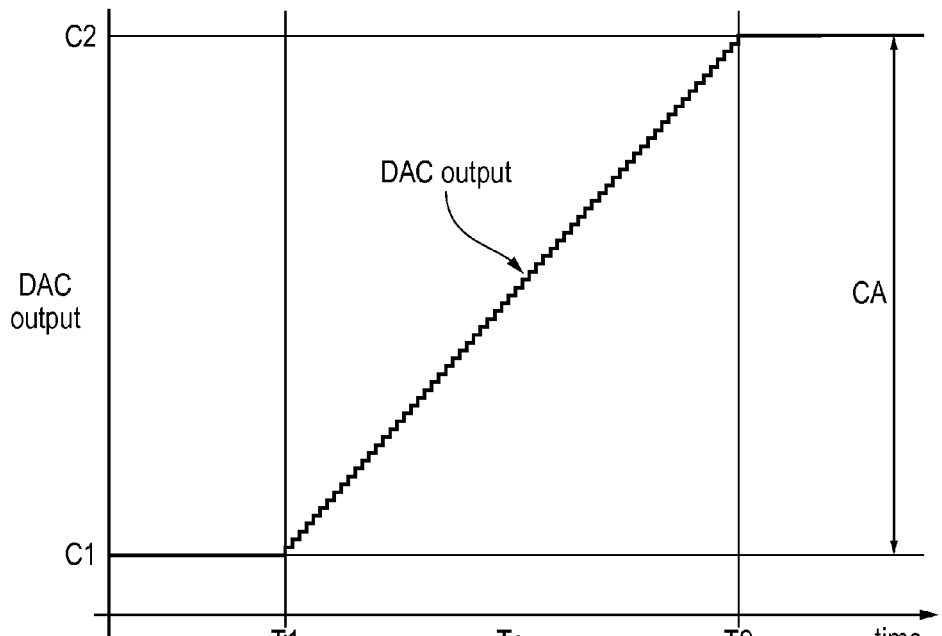
FIG. 4a is a timing diagram for a code change from the DAC of FIG. 1, 2, or 3 to implement a drain current or gain change in the amplifier.
Figure 4B:
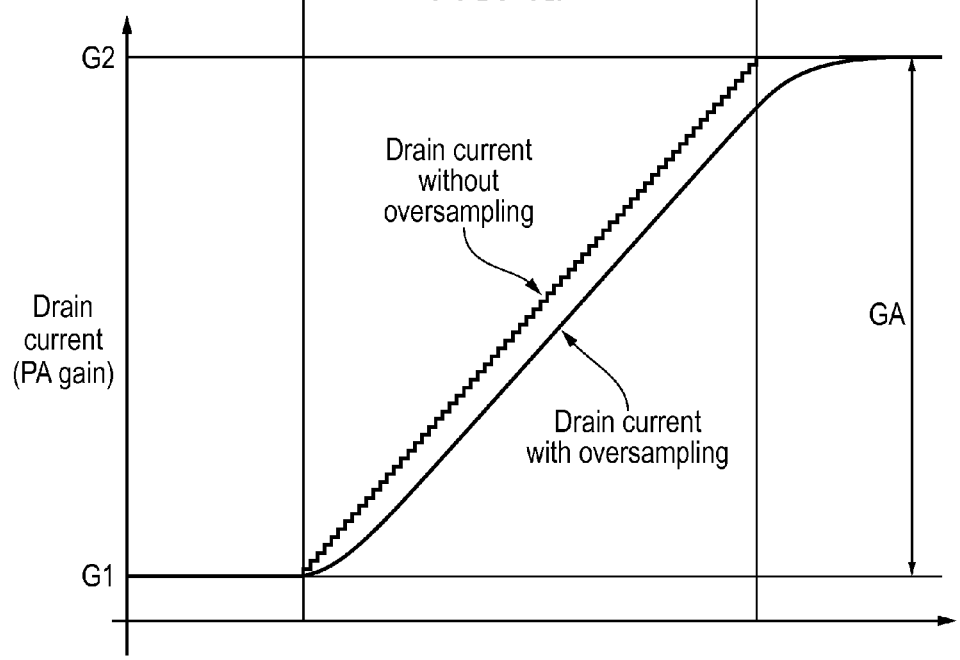
FIG. 4b shows the resulting drain current change for the amplifier shown in FIG. 1, 2 or 3.

Suppose, for example, that it is desired that the amplifier gain be changed from a first gain value G1 to a second gain value G2 by +/−GA. Furthermore, it is desired that this transition be resolved in a substantially linear manner over a time period Tg which as shown in FIGS. 4a and 4b spans from T1 to T2. The initial gain G1 is represented by a DAC code C1, the final gain G2 is represented by a DAC code C2, and the difference C2−C1 is represented by CA.

Suppose that Tg=10 milliseconds and GA=2 dB. If the DAC least significant bit (LSB) size corresponds to $\Delta G_{MAX}$, the transition can be described in 20 steps of $\Delta G_{MAX}$ each. If we divide the gain change of 2 dB equally throughout the time period Tg, then this implies that the DAC 50 should be updated at update period $T_{UPDATE}$ of every 500 microseconds. The DAC update process may be controlled by a finite state machine or other suitable control logic. The finite state machine may be arranged to start modifying the DAC output code as soon as a new gain value is requested. As an alternative, the finite state machine may be arranged to wait for a signal authorizing it to implement a new gain.

However, the inventors realized that the resolution of the DAC 50 can be reduced by way of using a discrete time integrator operating at a higher frequency. This can be regarded as using oversampling. Using this approach, the signal BF can be repeatedly sampled by the integrator 40 of the control circuit 2. Over-sampling allows a smaller step size to be achieved and may also allow the path of the slope to be modified to reduce possible overshoot as shown in FIG. 4b.

A possible implementation of the discrete time integrator is shown in FIG. 3, by means of introducing a switch 80 into the signal path from the summer 30 to the integrator 40. The switch 80 can be switched between a low impedance and high impedance state, and it can be switched at a frequency $F_{INTEGRATOR}$ giving rise to a sample occurring every $T_{INTEGRATOR}$. Furthermore, in each operating cycle the switch 80 can have an on period Ton and an off period Toff, with Ton/Toff giving a switch duty cycle, resulting in a modified overall time constant of the integrator. Other implementations are possible for the discrete integrator such as (and not limited to) switched capacitor topologies or current integrators.

If the bandwidth of the closed loop is set accordingly to provide the filtering desired, the step size for the transition from point G1 to G2 becomes independent of the DAC resolution and can be approximated as (FIG. 4b):

$$\text{Step size}=GA*T_{INTEGRATOR}/Tg$$

Thus, if the gain step is limited to $\Delta G_{MAX}$, the DAC resolution desired is reduced by a factor of $\log_2 (T_{UPDATE}/T_{INTEGRATOR})$ bits. A low pass reconstruction filter can be introduced between DAC 50 and summer 30 to attenuate the quantization noise of the DAC 50. Other techniques such as dithering can be used for the DAC 50 to further enhance resolution.

It should be noted that use of the switch 80 changes the integrator time constant in the embodiment of FIG. 3. This can be seen because over a unit period of time, the amount of charge passing through a resistor becomes reduced if the resistor is disconnected for part of the period, and this is equivalent to having a larger resistor connected for the entirety of the unit time period. From this it follows that the synthesized or effective RC product for the integrator 40 can be expressed as:

$$RC\_\text{effective}=Ri*Ci*((Toff+Ton)/Ton)$$

The use of a sampled RC integrator allows programming the integrator time constant over a broad range by pulse width modulation. Similar trimming can be achieved for a switched capacitor integrator at the expense of parasitics.

If, for example, the times were chosen such that Ton=50 nanoseconds (nS) and Toff=16.8 microseconds and the value RiCi is chosen to give a time constant of 2 microseconds, then the effective integrator time constant RC_effective would be 672 microseconds. These values may be counted down by dedicated or programmable counters. This can enable the actual values of Ri and Ci to be estimated to achieve the desired time constant. It can also allow for the possibility of varying the time constant in use.

From the above it can be seen that, in this example, $T_{UPDATE}$ has a frequency of around 60 KHz. Other update rates, oversampling rates and integration periods than those described above can be selected by the designer.

The use of a short sample time compared to the DAC update period, means that the current sense amplifier 22, where a discrete time amplifier is used, can be given much more time to settle, e.g., nearly all of the $T_{INTEGRATOR}$ period of this example. The operating frequency $F_{SENSE}$ of the current sense amplifier 22 can be advantageously synchronized with the integrator frequency $F_{INTEGRATOR}$.

In the context of the RF amplifier, the variation in transistor transconductance with variations in the drain current can be regarded as changing the response of the feedback loop, and hence the rate of gain change may vary as a function of the transistor transconductance. It may therefore be desirable to allow the ramp signal to be modified, either to provide some pre-distortion to its shape, or to deliberately introduce a small amount of overshoot near the end of the ramp before returning it to the target end point value. It may also be desirable to allow an ADC 100 to sample the output of the sense amplifier 22 such that a comparison can be made between expected current for a DAC code and the measured current. This may enable performance analysis to be performed by a suitably programmed data processor to allow adjustment of the DAC codes if desired, for example to compensate for environmental factors such as temperature, or aging factors. Alternative approaches to coping with a transistor gain that varies as a function of current include modifying the DAC output step size (as, for example, might be achieved with a multiplying DAC) to vary as a function of transistor gain and/or to modify the integrator time constant. This can be done by varying the ratio of the sample switch on time to off time (or the ratio of the capacitors for a switched capacitor implementation). Thus, the sample rate may itself be kept constant.

Figure 5A:
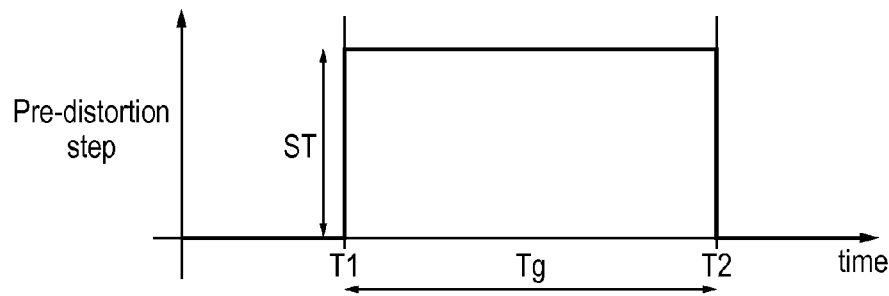
FIG. 5a presents an example of signal pre-distortion to improve the response of the closed loop controller.
Figure 5B:
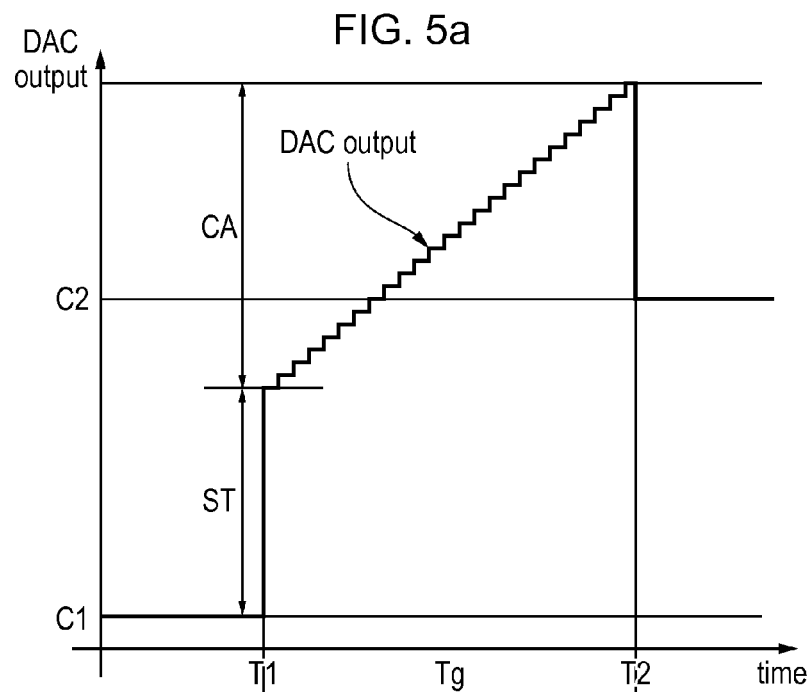
FIG. 5b shows a sum of a predistortion signal.
Figure 5C:
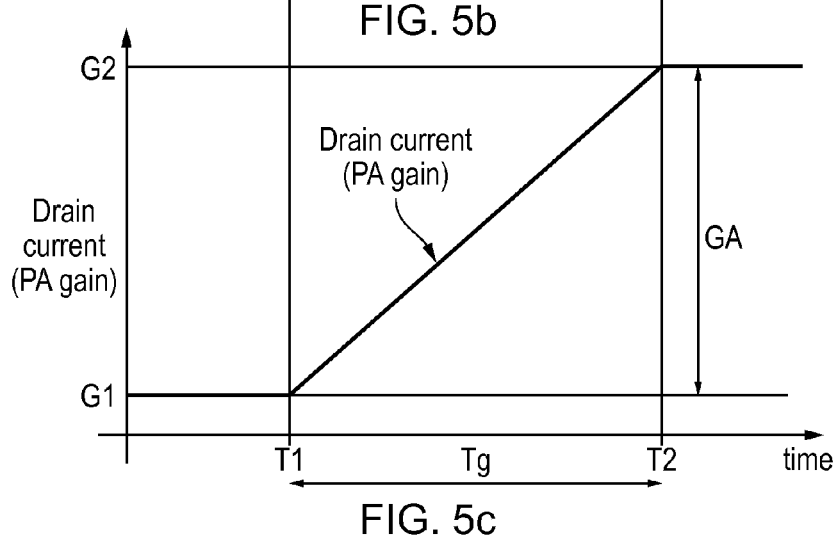
FIG. 5c shows a change in gain of the amplifier.

FIG. 5a presents an example of pre-distortion implemented by introducing a step signal ST for the duration of the ramp, from T1 to T2. This implementation eliminates the potentially unwanted nonlinear variation of the drain current towards the start (moment T1) and end (moment T2) of the ramp. In one embodiment, the size of the step ST is a direct function of the closed loop parameters, the size of the code change CA and duration of the ramp Tg. The step ST can be added to the DAC codes for the gain change, as shown in FIG. 5b, to get a linearized gain change, as shown in FIG. 5c.

Figure 6:
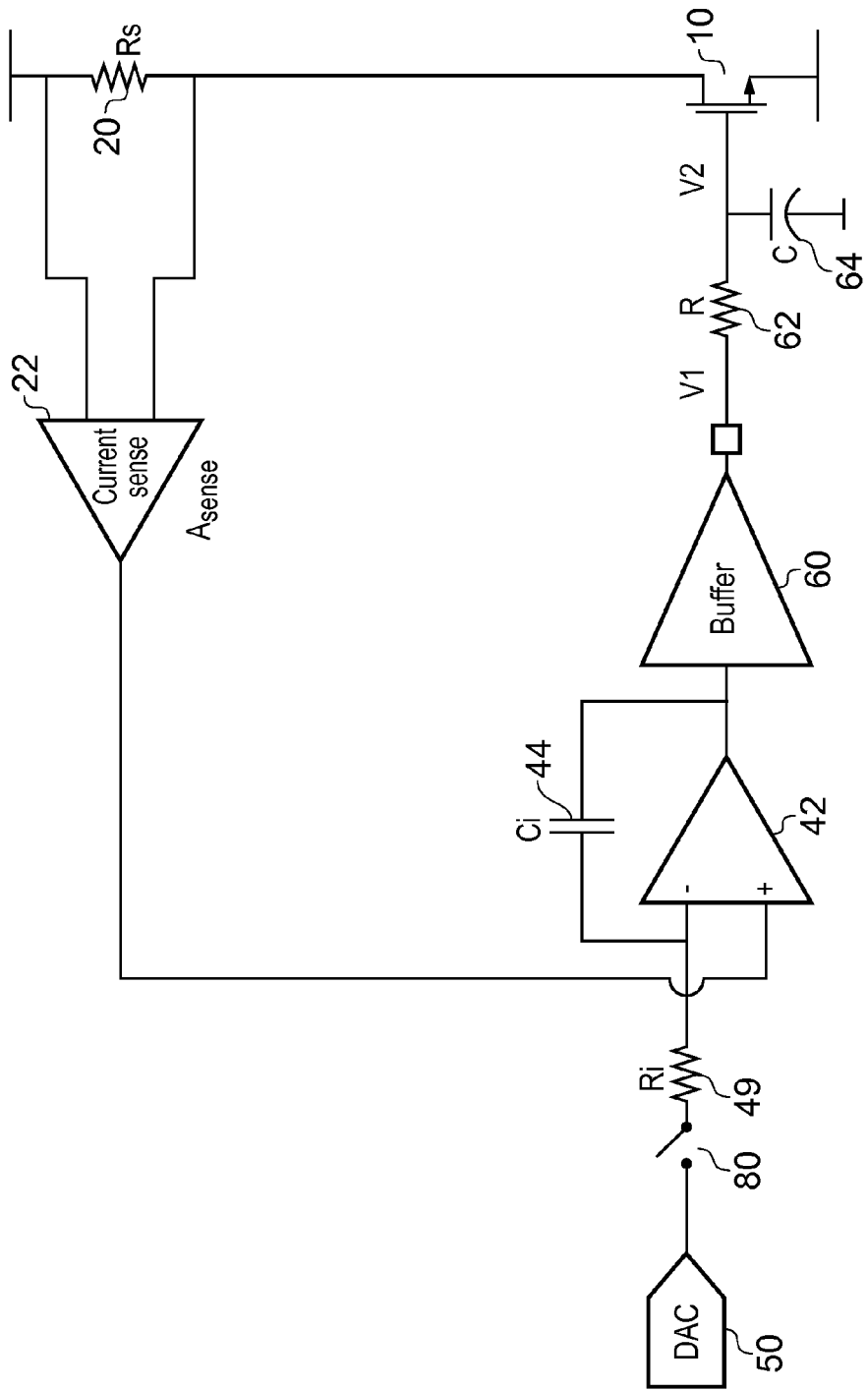
FIG. 6 shows a further variation where the input of the integrator acts as a summing junction.

It should be noted that other circuit configurations exist. FIG. 6 shows a variation, suitable for use with a single ended feedback amplifier signal, where the summer and integrator have been combined around the amplifier 42. In FIG. 6, the amplifier 42, the capacitor 44, and the resistor 49 are together configured to perform an integrating function based on a further signal formed as a function of the demand and feedback signals. The RF input, output and load components 12, 16 and 14 have been omitted for diagrammatic simplicity.

Figure 7:
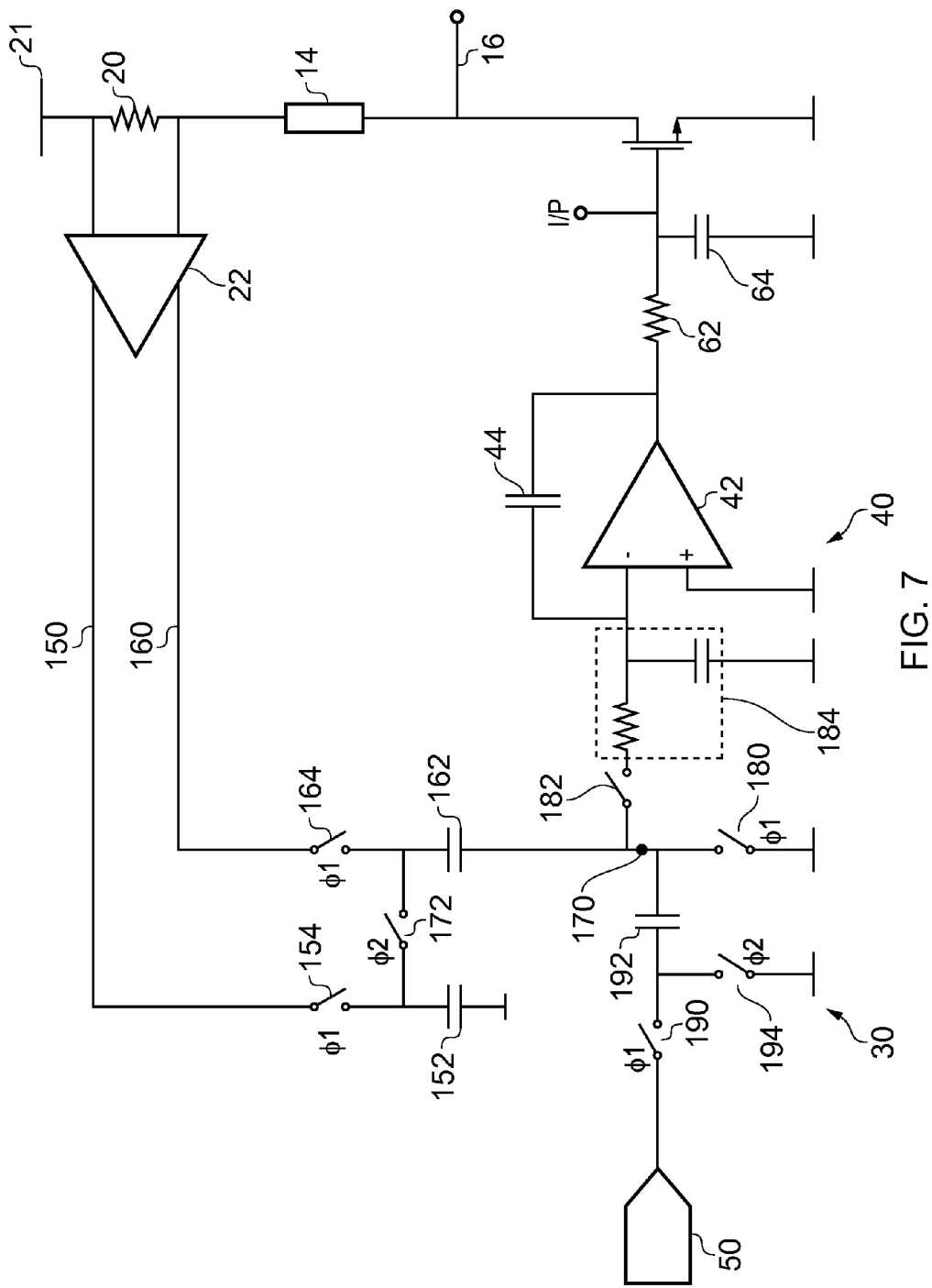
FIG. 7 shows a variation of the closed loop controller in accordance with another embodiment of this disclosure.

FIG. 7 shows a variation of the closed loop circuit in which the summer 30 has been implemented within a switched capacitor architecture, and the input resistor 49 has also been removed as the electric charge from the output of the summer is fed into the integrator feedback capacitor 44 via a switch. The current sense amplifier 22 is shown as having dual outputs 150 and 160. If the current sense amplifier 22 has a single ended output, then either capacitor 152 or 162, depending on the output polarity of the amplifier output, can be omitted. The output 150 is provided to a first plate of a first feedback signal sampling capacitor 152 by way of a switch 154. A second plate of the capacitor 152 is connected to a reference voltage, such as ground. The second output 160 is connected to a first plate of a second feedback signal sampling capacitor 162 by way of a switch 164. A second plate of the capacitor 162 is connected to a node 170. A switch 172 is connected between the first plates of the first and second sampling capacitors 152 and 162. The node 170 can be selectively connected to ground by way of an electrically operable switch 180. The node 170 can also be connected to the input of the integrator 40 by way of an electrically operable switch 182 connected between node 170 and an inverting input of the amplifier 42. A low pass filter 184 (formed by another capacitor in conjunction a resistor or with the switch 182 to synthesize an RC circuit) can be connected between the inverting input of the amplifier 42 and switch 182. The digital to analog converter 50 is connectable by way of an electrically controlled switch 190 to a first plate of a further signal capacitor 192 which can be regarded as a demand signal sampling capacitor, and which has its second plate connected to the node 170. A further electrically controlled switch 194 is operable to connect the first plate of the further capacitor 192 to ground.

In use, the switches illustrated in FIG. 7, with the exception of switch 182 are combined into two groups with switches 154, 164, 180 and 190 being made conducting in response to a signal φ1 being asserted, and switches 172 and 194 being made conducting in response to the assertion of a signal φ2. The signals φ1 and φ2 are arranged such that if, for example, switch 172 is conducting then switches 154 and 164 are in a high impedance state. A guard period may be inserted in the switching signals in order to ensure that none of the switches can be simultaneously on. Phase φ1 switches 154, 164, 180 and 190 are made conducting such that the capacitors 152 and 162 get charged to the voltages occurring at the outputs 150 and 160. At the same time, the capacitor 192 is charged to the value output by the digital to analog converter 50. Switches 154, 164, 180 and 190 are then made high impedance, and switches 172, 194 are made low impedance such that charge sharing occurs between the capacitors. The common mode signal from the output of the sense amplifier (signals 150 and 160) remains stored on capacitors 152 and 162, while only the differential signal is transferred. As a result, the node 170 can assume a voltage which corresponds to the difference between the voltages 150 and 160, less the output of the digital to analog converter 50. Once the charge sharing has occurred, and any transients have died down, the switch 182 can then be made conducting to transfer charge, or share charge with the integrator 42. As noted before, a low-pass filter 184 can be introduced after the switch 182 to filter the transfer of charge from the summer to the integrator 40 in order to reduce the spectral content from the output of the integrator 40. If the system is relatively insensitive to glitches at the output of the integrator 40, the low-pass filter 184 can be removed and switch 182 can be driven by φ2. After an integration period determined by the time for which φ2 is asserted, φ2 can be de-asserted and φ1 asserted again, and so on.

Figure 8:
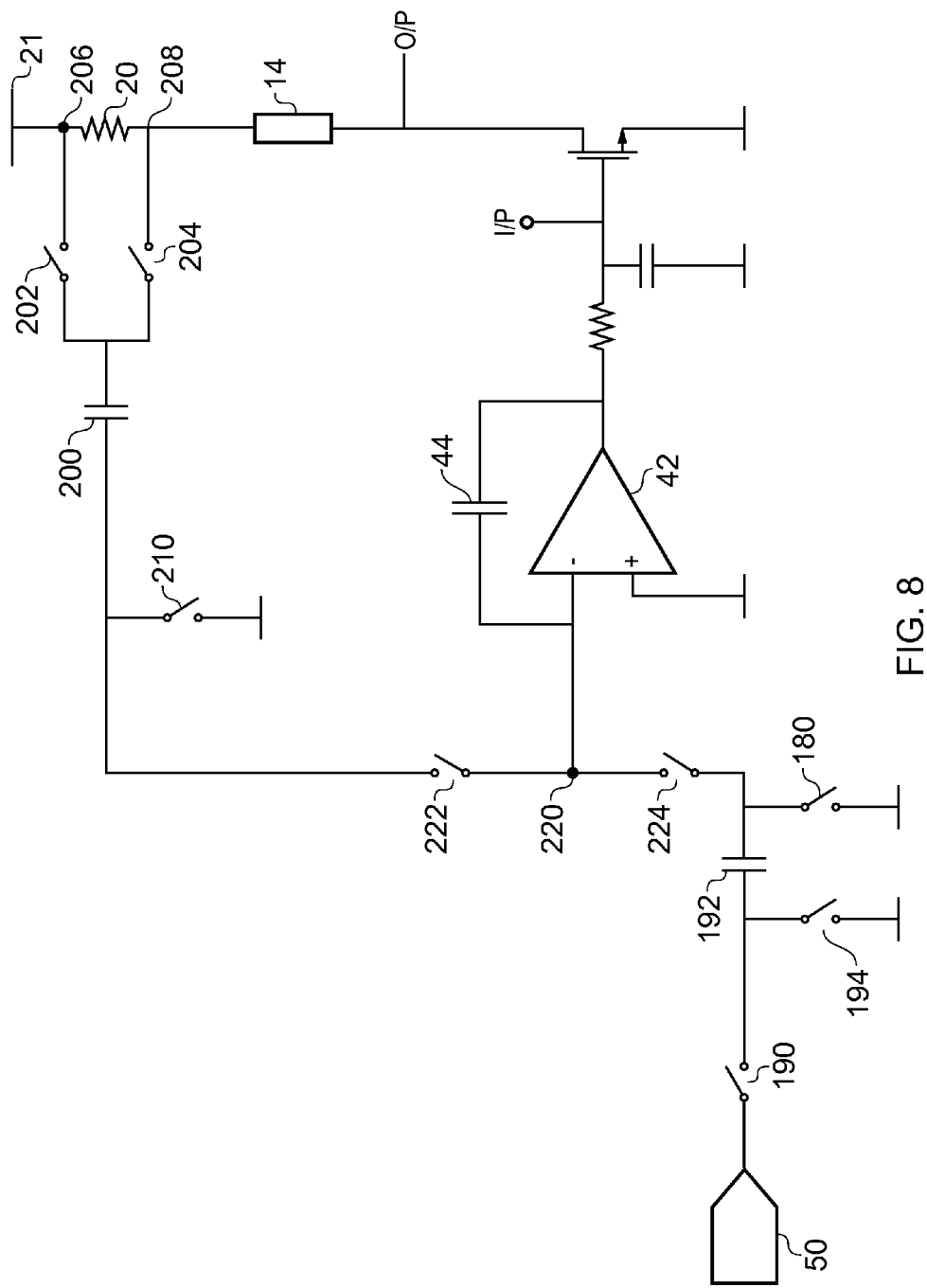
FIG. 8 shows a further variation of the closed loop controller.

In a further variation as shown in FIG. 8, the current sense amplifier 22 can be dispensed with and a feedback signal sampling capacitor 200 can be provided in association with switches 202 and 204. The switches 202 and 204 can selectively connect a first plate of the capacitor 200 to first and second nodes 206 and 208, respectively, on either side of the current sensing resistor 20. In FIG. 8, a further switch 210 is arranged to selectively connect the second plate of the capacitor 200 to a reference voltage, such as ground. In use, the switches can be combined into two complementary groups with switches 180, 190 210 and 204 being made conducting in response to a signal φ1 being asserted, and switches 194, 222, 224 and 202 being made conducting in response to the assertion of a signal φ2. A guard period may be inserted in the switching signals in order to ensure that signals φ1 and φ2 are not asserted at the same time. During phase φ1 switches 204, 210, 190 and 180 are made conducting such that capacitor 200 is charged at the voltage occurring at node 208 and capacitor 192 is charged at the voltage occurring at the output of the digital to analog converter. Once this has been done, the switches 204 and 210 can be made high impedance. During phase φ2 switches 202, 222, 194 and 224 are made conducting and node 220 acts as a virtual ground, matching the potential of the non-inverting input of the operational amplifier 42. This way, the electric charge transferred from capacitor 200 to the summing node 220 is proportional to the voltage difference across the sense resistor 20. Also the electric charge stored on capacitor 192 during phase φ1 is transferred to node 220. The difference between the electric charge displacement from capacitors 200 and 192 is fed into the integrator feedback capacitor 44 and converted into a voltage change of the integrator output. As illustrated, the magnitude of the integrator output voltage variation during phase φ2 is dependent on the signal on the sense resistor and DAC output, and the size of capacitors 192, 200 and 44. The size of capacitors can be changed or trimmed in order vary the signal attenuation and the closed loop time constant.

Had the switches 202 and 204 been operated in a different sequence, then the electric charge transferred from capacitor 200 could have an opposite polarity. A similar signal inversion can be achieved by interchanging the control signals for switches 190 and 194. This can be useful, in particular, if the integrator 40 has a non-inverting transfer function. A glitch-reject circuit similar to the one from FIG. 7, built of a circuit such as (but not limited to) switch 182 (FIG. 7) and/or a low-pass filter may be introduced between node 220 and the integrator input, if desired. The ground connection of switches 194, 180, 210 and non-inverting input of amplifier 42 can be replaced with a signal or reference sources, if other signals (such as pre-distortion signal) are to be summed or subtracted in the signal path. Charge injection cancellation circuits may be introduced, if desired, depending on the implementation of the switches.

Thus a difference between the output of the DAC 50, and the voltage across the sensing resistor 20 can be formed at the summing node 220 without the use of a differential amplifier or a dedicated summing circuit. These features can be implemented by a network of capacitors and switches if the circuit designer so desires.

As noted before, the switches may be field effect transistors. However, in some instances the voltage levels may be inappropriate, for example, because the voltages occurring around nodes 206 and 208 are too high. This may cause a difficulty when generating a suitable drive signal to the transistors forming the switches 202 and 204, or maintaining isolation between those devices and other parts of the circuits. Under such circumstance, different switching technologies may be used, for example MEMS switches, which are mechanical switches operated by electrostatic force. Alternatively, capacitive potential dividers may be used in place of the amplifier 20 to transform the differential voltage from a high voltage domain to a different (and generally lower) voltage domain.

Hitherto the current of the transistor 10 can be measured as being a proxy for the gain of the transistor 10. However, it is also possible to take any of the embodiment disclosed hereinbefore, and to dispense with the current measuring and instead to estimate the gain of the transistor 10 directly or in any other suitable manner.

Figure 9:
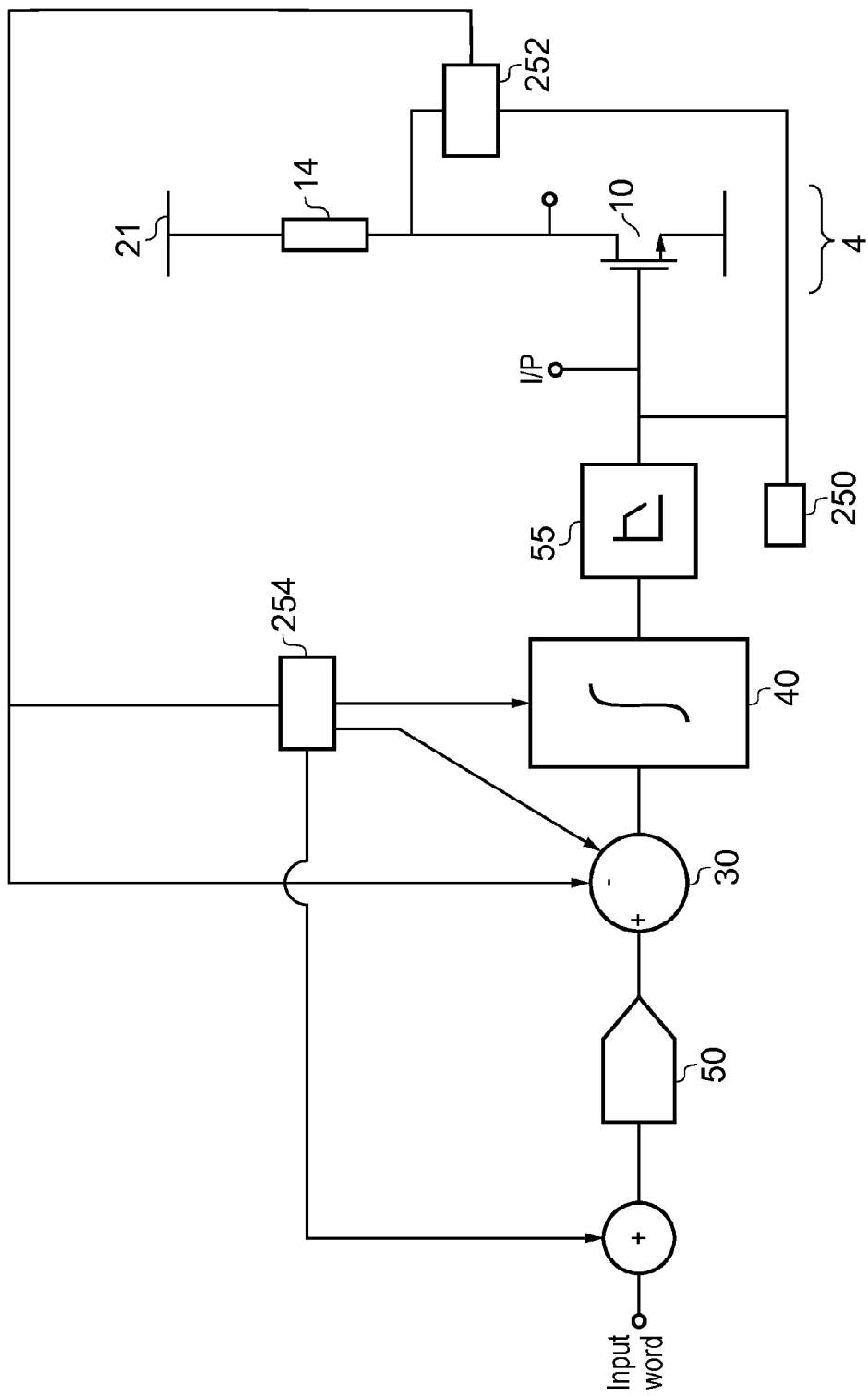
FIG. 9 shows a direct gain measurement approach that can be used with any of the other embodiments described herein.

In the context of high frequency communication systems, for example operating at several hundred MHz and above all the way up to microwaves (although the pass-band of the amplifier may only be a fraction of this possible frequency range), it is possible to inject a test signal outside of the operating bandwidth, for example relatively close to DC, and to measure the resulting change of gain of the transistor 10. Such an arrangement is shown in FIG. 9 where a test signal generator 250 is operable to inject a relatively low frequency signal, compared to the bandwidth of operation, to the gate of the transistor 10. The test signal is amplified by the transistor 10 and an amplified signal is provided at its drain. The amplified signal is provided to a first input of a gain estimator 252. The test signal from the test signal generator 250 is provided to a second input of the gain estimator 252. The gain estimator 252 compares the amplitude of the test signal with that of the amplified test signal in order to produce an estimate of gain, which can then be converted by a suitable scaling function within the gain estimator 252 to be provided to the subtracting input of the summer 30.

Another possible method to evaluate the low-frequency gain of the transistor is to compare the rate of change between Vgs (gate to source voltage) of the transistor 10 and the voltage drop on a resistive load connected in series with the drain or source of the transistor 10. This gain calibration can be achieved when the power amplifier high-frequency gain is changed between different settings. For a known value of the resistive load, the user can infer the value of the transistor transconductance and estimate the value of the RF gain.

It should be noted that because the gain of the transistor 10 varies with the current, then the gain of the closed loop also varies. It may be desirable to accommodate for this by providing a signal to modify the operation of the integrator 40. Thus, an estimate of the gain from the gain estimator 252 may be provided to an integrator controller 254 which serves to modify the operation of the integrator 40. The gain estimator 252 can be used for functions that will change the operation of the loop, such as: selecting a different sized capacitor in the integrator 40 or the summer 30, modifying the switching frequency of the switches associated with the integrator 40 and the summer 30, produce a pre-distortion signal to be introduced in the summer 30 or DAC 50 input, or other signal processing desired by the user.

In further variations, the current may be measured, but not directly from the path to the transistor 10. In some circumstances, the transistor 10 may be associated with a matched transistor driven from the same bias voltage, and the current through this matched transistor may be measured instead as a proxy for the current through the transistor 10.

In variations of the arrangement shown in FIG. 9 working at, for example, radio frequencies up to several GHz, the output from the amplifier 4 may be tapped off and demodulated, for example by down conversion, to provide an estimate of the amplitude of the amplified signal. In microwave applications, the signal may be tapped off by use of a directional coupler and then provided to a modulator, such as a PIN diode in order to detect the amplitude of the signal.

In a data communication system, several of the closed loop controllers described herein may be provided within a control circuit in combination with other components, such as open loop controllers and power sequencers for handling start up and shut down operations. The demand value may itself be controlled by a further control loop, which may include components, such as level detectors, for measuring a transmit power of the base station.

It is thus possible to provide an improved controller, and an amplifier in association with such a controller.

According to an embodiment of this disclosure, an apparatus comprises an amplifier and a control circuit configured to generate a bias signal for the amplifier. The control circuit comprises a switch and an integrator. The switch is configurable into at least a low impedance state and a high impedance state. The integrator is configured to to receive a sampled input signal from the switch. The integrator is also configured to generate an integration signal representing an integration of a sampled difference between a demand signal and a feedback signal. The demand signal is indicative of a desired value of an output of the amplifier. The feedback signal is indicative of the output of the amplifier. The control circuit is configured to generate the bias signal based on the integration signal. In certain implementations, the switch circuit can change state from the low impedance state to the high impedance state at a rate that is faster than a rate at which the demand signal is updated, for example, by a digital to analog converter.

The systems, apparatus, and methods related to a closed loop controller for an amplifier are described above with reference to certain embodiments. A skilled artisan will, however, appreciate that the principles and advantages of the embodiments can be used for any other suitable systems, apparatus, or methods.

Such systems, apparatus, and/or methods can be implemented in various electronic devices. Examples of the electronic devices can include, but are not limited to, consumer electronic products, parts of the consumer electronic products, electronic test equipment, wireless communications infrastructure, etc. Examples of the electronic devices can also include memory chips, memory modules, circuits of optical networks or other communication networks, and disk driver circuits. The consumer electronic products can include, but are not limited to, measurement instruments, medical devices, wireless devices, a mobile phone (for example, a smart phone), cellular base stations, a telephone, a television, a computer monitor, a computer, a hand-held computer, a tablet computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic device can include unfinished products.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the Description of Some Example Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error.

The teachings of the inventions provided herein can be applied to other systems, not necessarily the systems described above. The elements and acts of the various embodiments described above can be combined to provide further embodiments. The act of the methods discussed herein can be performed in any order as appropriate. Moreover, the acts of the methods discussed herein can be performed serially or in parallel, as appropriate.

While certain embodiments of the inventions have been described, these embodiments have been presented by way of example only, and are not intended to limit the scope of the disclosure. Indeed, the novel methods and systems described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A control circuit comprising a processing circuit configured to receive a demand signal representing a desired value of a measurand, and a feedback signal representing the measurand, wherein the processing circuit is configured to perform at least a discrete time integrating function based on a further signal formed as a function of the demand and feedback signals, wherein the at least one of the demand signal, the feedback signal or the further signal is processed or acquired in a sampled and periodic manner, and wherein the control circuit is configured to generate a control signal to control a gain of an amplifier.

2. A control circuit as claimed in claim 1, in which the processing circuit has a first input for receiving the demand signal, and wherein the demand signal is updated in a discontinuous manner, and a time period between updates is $T_{UPDATE}$, and wherein a sampling circuit within the control circuit is configured to sample the demand signal or the further signal every $T_{INTEGRATOR}$, where $T_{INTEGRATOR}$ is less than $T_{UPDATE}$.

3. A control circuit as claimed in claim 1, in which the processing circuit comprises an integrator configured to perform the integrating function, and a switch in series with the integrator, and a duty cycle of the switch is controlled so as to modify a time constant of the integrator.

4. A control circuit as claimed in claim 3, in which the integrator comprises a resistor-capacitor network or a switched capacitor associated with an amplifier configured to integrate an input to the amplifier.

5. A control circuit as claimed in claim 1, further including a digital analog converter configured to supply the demand signal.

6. A control circuit as claimed in claim 1, in which the control signal is arranged such that the demand signal is sampled onto a demand signal sampling capacitor, and a voltage difference across a sense resistor is sampled onto at least one feedback signal sampling capacitor and the sample values held on the demand signal sampling capacitor and the at least one feedback signal sampling capacitor are combined.

7. A control circuit as claimed in claim 6, in which the demand signal sampling capacitor and the at least one feedback signal sampling capacitor are connectable by way of at least one switch to charge share and thereby act as a summer.

8. An apparatus comprising a radio frequency amplifier including a transistor where a current through the transistor is to be set to a desired value, said apparatus further comprising the control circuit as claimed in claim 1, wherein the control circuit is configured to provide the control signal to the radio frequency amplifier, and wherein the radio frequency amplifier is the amplifier.

9. An apparatus as claimed in claim 8, further including a signal injection circuit configured to inject a radio frequency signal to a control terminal of the transistor, said signal injection circuit further including a bias element configured to apply a bias voltage to the transistor to set a quiescent current through the transistor.

10. An apparatus as claimed in claim 8, where the transistor is a Gallium Arsenide or other high carrier mobility transistor where a quiescent or low frequency current magnitude sets a transistor gain, and where the demand signal is generated from a look up table or electronically-implemented algorithm to set the gain to a desired value or to change the gain by a desired amount, and where the gain is mapped to at least a current flow through the transistor.

11. An apparatus as claimed in claim 10, further including a second amplifier control loop, including a circuit configured to measure the power of a radio frequency signal and to adjust the demand signal.

12. A method of generating a control signal to control a gain of an amplifier, the method comprising:
receiving a demand signal representing a desired value of a measurand;
receiving a feedback signal representing the measurand;
performing at least a discrete time integrating function based on a further signal formed as a function of the demand and feedback signals, wherein at least one of the demand signal, the feedback signal or the further signal is processed or acquired in a sampled and periodic manner; and
generating the control signal to control the gain of the amplifier based on said performing.

13. A method as claimed in claim 12, further comprising supplying the demand signal to a first input of a summing circuit, supplying the feedback signal to a second input of the summing circuit, in which the summing circuit is configured to form the further signal as a difference between the demand signal and the feedback signal, and the method further comprising supplying the further signal to an integrator configured to perform the discrete time integrating function.

14. A method as claimed in claim 12, further comprising operating a discrete time current sense amplifier at an amplifier frequency, and sampling the demand signal or the further signal at a sample frequency, where the amplifier frequency is substantially equal to the sample frequency.

15. A method as claimed in claim 14, in which an integrator is configured to perform the discrete time integrating function, the method further comprising generating a discrete time constant using the integrator to form a dominant pole in a response characteristic and allow usage of feedback path amplifiers with limited bandwidth or an output that is sampled or chopped.

16. An apparatus comprising:
an amplifier; and
a control circuit configured to generate a bias signal to bias the amplifier, the control circuit comprising:
a switch configured to provide a sampled signal by transitioning between low impedance and high impedance states at a switching frequency in a periodic manner; and
an integrator configured to receive the sampled signal from the switch and to generate an integration signal representing a discrete time integration of a sampled difference between a demand signal and a feedback signal, wherein the demand signal is indicative of a desired value of an output of the amplifier, and
wherein the feedback signal is indicative of the output of the amplifier;

wherein the control circuit is configured to generate the bias signal based on the integration signal.

17. An apparatus as claimed in claim 16, in which the apparatus is configured to modify a duty cycle of the switch so as to control a time constant of the integrator.

18. An apparatus as claimed in claim 16, in which the feedback signal is representative of a current through a load or through a transistor.

19. An apparatus as claimed in claim 18, where the current flows through a current sensing component, and an output from the current sensing component is provided to a current sense amplifier.

20. A control circuit as claimed in claim 19, further comprising a low-pass filter electrically coupled between the current sensing component and the current sense amplifier.

21. An apparatus as claimed in claim 16, wherein the control circuit further comprises an input configured to receive a pre-distortion signal to modify a response of the amplifier.

22. An apparatus as claimed in claim 16, wherein the amplifier is configured to amplify a radio frequency signal.

* * * * *

UNITED STATES PATENT AND TRADEMARK OFFICE
CERTIFICATE OF CORRECTION

PATENT NO. : 9,705,465 B2
APPLICATION NO. : 14/464611
DATED : July 11, 2017
INVENTOR(S) : Rares Andrei Bodnar et al.

Page 1 of 1

It is certified that error appears in the above-identified patent and that said Letters Patent is hereby corrected as shown below:

In Column 13 at Line 44, in Claim 5, after "digital" insert --to--.

Signed and Sealed this
Thirty-first Day of October, 2017

Joseph Matal
*Performing the Functions and Duties of the*
*Under Secretary of Commerce for Intellectual Property and*
*Director of the United States Patent and Trademark Office*